United States Patent
Choi et al.

(10) Patent No.: US 9,553,236 B2
(45) Date of Patent: Jan. 24, 2017

(54) LIGHT EMITTING DEVICE

(71) Applicant: LG INNOTEK CO., LTD., Seoul (KR)

(72) Inventors: Jae Hoon Choi, Seoul (KR); Young Jae Choi, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/273,927

(22) Filed: May 9, 2014

(65) Prior Publication Data

US 2014/0339565 A1    Nov. 20, 2014

(30) Foreign Application Priority Data

May 14, 2013 (KR) ........................ 10-2013-0054094

(51) Int. Cl.
| | |
|---|---|
| H01L 33/12 | (2010.01) |
| H01L 33/32 | (2010.01) |
| H01L 21/02 | (2006.01) |
| H01L 33/02 | (2010.01) |
| H01L 33/00 | (2010.01) |

(52) U.S. Cl.
CPC ......... *H01L 33/325* (2013.01); *H01L 21/0237* (2013.01); *H01L 21/0254* (2013.01); *H01L 21/0262* (2013.01); *H01L 21/02458* (2013.01); *H01L 21/02488* (2013.01); *H01L 21/02505* (2013.01); *H01L 21/02513* (2013.01); *H01L 21/02576* (2013.01); *H01L 33/025* (2013.01); *H01L 33/12* (2013.01); *H01L 33/007* (2013.01)

(58) Field of Classification Search
CPC ...................................................... H01L 33/12
See application file for complete search history.

(56) References Cited

U.S. PATENT DOCUMENTS

| | | | |
|---|---|---|---|
| 2007/0194329 A1 | 8/2007 | Kim | 357/79 |
| 2010/0320506 A1 | 12/2010 | Varangis et al. | 257/201 |
| 2011/0272703 A1 | 11/2011 | Lee et al. | 257/76 |
| 2011/0309327 A1 | 12/2011 | Jeong | 257/13 |
| 2012/0205616 A1 | 8/2012 | Zhang et al. | 257/13 |
| 2014/0264392 A1* | 9/2014 | Okushiba | 257/84 |

FOREIGN PATENT DOCUMENTS

| | | |
|---|---|---|
| EP | 2 398 076 A2 | 12/2011 |
| JP | 2011-216549 A | 10/2011 |

OTHER PUBLICATIONS

EPO Machine translation of JP 2011-216549, dated Oct. 27, 2011.*
European Search Report dated Oct. 21, 2014 issued in Application No. 14167223.8.

* cited by examiner

*Primary Examiner* — Peniel M Gumedzoe
*Assistant Examiner* — Christopher Johnson
(74) *Attorney, Agent, or Firm* — Ked & Associates LLP (57) ABSTRACT

A light emitting device includes a first conductive semiconductor layer on a substrate, a control layer interposed between the substrate and the first conductive semiconductor layer. The control layer includes a first nitride semiconductor layer having aluminum (Al), a plurality of nano-structures on the first nitride semiconductor layer, and a second nitride semiconductor layer provided on the first nitride semiconductor layer and having gallium (Ga).

19 Claims, 11 Drawing Sheets

LIGHT EMITTING DEVICE

CROSS-REFERENCE TO RELATED APPLICATION

This application claims priority under 35 U.S.C. §119 to Korean Patent Application No. 10-2013-0054094 filed on May 14, 2013, which is hereby incorporated by reference in its entirety.

BACKGROUND

1. Field

The embodiment relates to at least one of a semiconductor device, a light emitting device or an electronic device.

2. Background

Various electronic devices and light emitting devices have been developed by using compound semiconductor materials. The electronic devices may include solar cells, photodetectors, or power devices.

The electronic devices or the light emitting devices may be fabricated based on a semiconductor substrate. The semiconductor substrate includes a growth substrate and a compound semiconductor layer grown on the growth substrate.

The semiconductor substrate may have various defects caused due to a lattice constant and a thermal expansion coefficient between the growth substrate and the compound semiconductor layer. Dislocation is caused by the difference in lattice constant between the growth substrate and the compound semiconductor layer, so that the crystallinity may be degraded. In addition, stress is generated by the difference in thermal expansion coefficient between the growth substrate and the compound semiconductor layer. Accordingly, due to the stress, cracks may occur in the compound semiconductor layer or the growth substrate may be broken. Since cracks occur in the compound semiconductor layer, a high quality semiconductor layer serving as the light emitting device or the electronic device may not be grown at a higher thickness.

BRIEF DESCRIPTION OF THE DRAWINGS

The embodiments will be described in detail with reference to the following drawings in which like reference numerals refer to like elements wherein.

DETAILED DESCRIPTION

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

Figure 1:
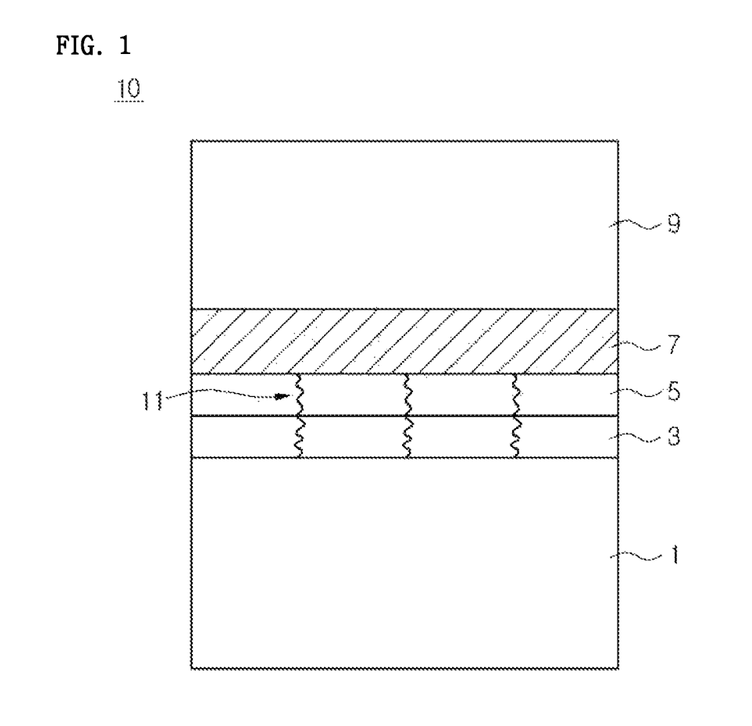
FIG. 1 is a sectional view showing a semiconductor substrate according to the embodiment.

FIG. 1 is a sectional view showing a semiconductor substrate 10 according to the embodiment. The semiconductor substrate 10 according to the embodiment may include a growth substrate 1, a control layer 7, and a conductive semiconductor layer 9.

The semiconductor substrate 10 according to the embodiment may further include a buffer layer 3 interposed between the growth substrate 1 and the control layer 7. The semiconductor substrate 10 according to the embodiment may further include a non-conductive semiconductor layer 5 interposed between the growth substrate 1 and the control layer 7 or between the buffer layer 3 and the control layer 7, but the embodiment is not limited thereto.

The buffer layer 3, the non-conductive semiconductor layer 5, the control layer 7, and the conductive semiconductor layer 9 may be formed of $Al_xIn_yGa_{(1-x-y)}N$ ($0<x<1$, $0<y<1$, and $0<x+y<1$) including a group II-VI or III-V compound semiconductor material. For example, the buffer layer 3, the non-conductive semiconductor layer 5, the control layer 7, and the conductive semiconductor layer 9 may include at least one selected from the group consisting of InAlGaN, GaN, AlGaN, InGaN, AlN, InN, and AlInN, but the embodiment is not limited thereto.

The buffer layer 3, the non-conductive semiconductor layer 5, the control layer 7, and the conductive semiconductor layer 9 may be simultaneously or sequentially formed using single equipment, for example, MOCVD equipment, but the embodiment is not limited thereto. In other words, after loading and securely mounting the growth substrate 1 into a chamber of the MOCVD equipment, a row material including a group II-VI or III-V compound semiconductor material, trimethyl gallium (TMGa), trimethyl indium (TMIn), trimethyl aluminum (TMAl), ammonia gas (NH3), and nitrogen gas (N2) are introduced into the chamber, thereby forming the buffer layer 3, the non-conductive semiconductor layer 5, the control layer 7, and the conductive semiconductor layer 9. For the conductive semiconductor layer 9, dopants, for example, silane gas (SiH4; N-type dopants) or bis(ethylcyclopentadienyl) magnesium (EtCp2Mg) may be additionally introduced into the chamber in addition to the raw material.

In the semiconductor substrate 10 according to the embodiment, layers may be additionally formed thereon so that the light emitting device or the electronic device may be fabricated. In other words, the semiconductor substrate 10 according to the embodiment may be used as a substrate member for the light emitting device or the electronic device. Therefore, it is important to minimize or completely remove defects, such as a dislocation 11, a pit 13, cracks, and non-uniform stress, which may be formed in the semiconductor substrate 19.

The growth substrate 1 is used to grow the conductive semiconductor layer 9 while supporting the conductive semiconductor layer 9, and may include a material appropriate to the growth of a semiconductor material. The growth substrate 1 may be formed a material having a lattice constant and thermal stability approximate to those of the conductive semiconductor layer 9, and may include one of a conductive substrate, a compound semiconductor substrate, and an insulating substrate, but the embodiment is not limited thereto.

For example, the growth substrate 1 may include at least one selected from the group consisting of sapphire (Al2O3), SiC, Si, GaAs, GaN, ZnO, GaP, InP and Ge.

The growth substrate 1 may include dopants to have conductivity, but the embodiment is not limited thereto. The growth substrate 1 including the dopants may serve as an electrode layer, but the embodiment is not limited thereto.

Even if the growth substrate 1 having the lattice constant approximate to that of the conductive semiconductor layer 9 is used, the difference is made in lattice constant and thermal expansion coefficient between the growth substrate 1 and the conductive semiconductor layer 9, so that defects such as the dislocation 11 or cracks may be formed.

In order to reduce the defects, the buffer layer 3 may be formed between the growth substrate 1 and the conductive semiconductor layer 9, but the embodiment is not limited thereto.

The buffer layer 3 may reduce the difference in lattice constant between the growth substrate 1 and the conductive semiconductor layer 9 or may prevent the material constituting the growth substrate 1 from being diffused into the conductive semiconductor layer 9. In addition, the buffer layer 3 may prevent a recess from being formed in the top surface of the growth substrate 1 due to a melt-back phenomenon or may control stress to prevent cracks in the conductive semiconductor layer 9 or to prevent the growth substrate 1 from being broken, but the embodiment is not limited thereto.

The buffer layer 3 may be formed of a compound semiconductor material including Al in order to perform the above various functions. For example, the buffer layer 3 may include AlN or InAlGaN, but the embodiment is not limited thereto.

The non-conductive semiconductor layer 5 may be formed on the buffer layer 3. The non-conductive semiconductor layer 5 may be formed to obtain superior crystallinity and make a surface flat.

In addition, the non-conductive semiconductor layer 5 may serve as a seed layer to easily form the conductive semiconductor layer 9 thereon, but the embodiment is not limited thereto.

The conductive semiconductor layer 9 may include dopants. For example, the conductive semiconductor layer 9 may include an N-type semiconductor layer including N-type dopants, but the embodiment is not limited thereto. The N-type dopants may include at least one of Si, Ge, Sn, Se and Te, but the embodiment is not limited thereto.

The conductive semiconductor layer 9 may include a conductive layer to generate electrons, but the embodiment is not limited thereto. The conductive semiconductor layer 9 may have the thickness of 2 μm.

However, stress is generated by the difference in thermal expansion coefficient between the growth substrate 1 and the conductive semiconductor layer 9. Accordingly, due to the stress, cracks may occur in the conductive semiconductor layer 9, or the growth substrate 1 may be broken. Therefore, the thickness of the conductive semiconductor layer 9 may be determined depending on the control degree of the stress.

According to the embodiment, to prevent the growth substrate 1 from being broken or to prevent cracks in the growth substrate 1 by controlling stress, the control layer 7 may be formed between the growth substrate 1 and the conductive semiconductor layer 9. In addition, the control layer 7 blocks the dislocation 11 so that the dislocation 11 is not moved up to improve the crystallinity the conductive semiconductor layer 9.

Figure 2:
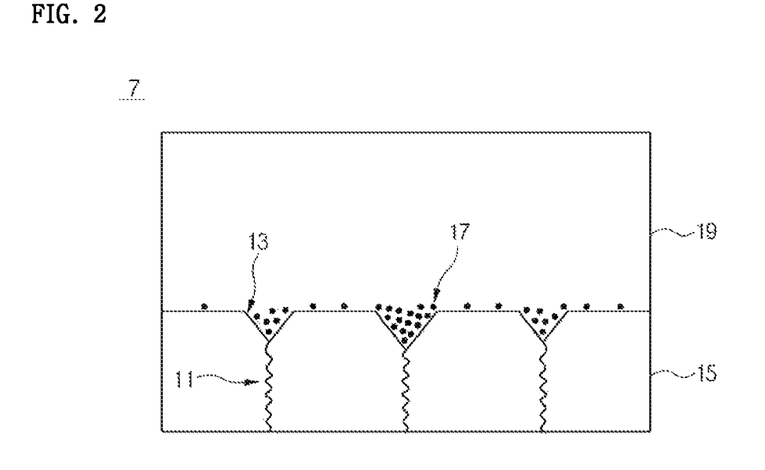
FIG. 2 is a sectional view showing a control layer according to a first embodiment.

FIG. 2 is a sectional view showing the control layer 7 according to a first embodiment. The control layer 7 according to the first embodiment may include a first nitride semiconductor layer 15, a plurality of nano-structures 17, and a second nitride semiconductor layer 19.

The first nitride semiconductor layer 15 may include a semiconductor layer formed of AlxInyGa(1-x-y)N (0<x<1, 0<y<1, and 0<x+y<1) including a group II-VI or III-V compound semiconductor material. For example, the buffer layer 3, the non-conductive semiconductor layer 5, the control layer 7, and the conductive semiconductor layer 9 may include at least one selected from the group consisting of InAlGaN, GaN, AlGaN, InGaN, AlN, InN, and AlInN, but the embodiment is not limited thereto.

For example, the first nitride semiconductor layer 15 may include an Al-based nitride semiconductor layer, but the embodiment is not limited thereto. For example, the first nitride semiconductor layer 15 may include AlN or AlGaN, but the embodiment is not limited thereto.

For example, the second nitride semiconductor layer 19 may include a Ga-based nitride semiconductor layer, but the embodiment is not limited thereto. For example, the second nitride semiconductor layer 19 may include GaN or AlGaN, but the embodiment is not limited thereto.

At least one of the first and second nitride semiconductor layers 15 and 19 may include dopants or may not include dopants.

The dislocation 11 occurring in the non-conductive semiconductor layer 5 may be moved up to the first nitride semiconductor layer 15. In this case, the dislocation 11 may occur in the first nitride semiconductor layer 15. The top surface of the first nitride semiconductor layer 15 is inwardly sunken so that the pit 13 may be formed. In addition, a pin hole (not shown) may be formed through the top and bottom surfaces of the first nitride semiconductor layer 15.

The nano-structures 17 may be formed on the top surface or the inner part of the first nitride semiconductor layer 15. In this case, the inner part of the first nitride semiconductor layer 15 may refer to the pit 13 or the pin hole. The nano-structures 17 may be randomly formed, but the embodiment is not limited thereto.

The nano-structures 17 may be spaced apart from each other in a horizontal direction. The nano-structures 17 may have a significant thin thickness to the extent that the height of the nano-structures 17 may not be measured. Since each nano-structure 17 is randomly formed, the nano-structures 17 may have heights different from each other, but the embodiment is not limited thereto. For example, each nano-structure 17 may have the thickness of 3 Å to 50 Å, but the embodiment is not limited thereto.

The nano-structure 17 may include a group IV-V compound semiconductor material including SiN, but the embodiment is not limited thereto.

Although the nano-structure 17 may be formed in the form of one assembly or at least two assemblies, the nano-structure 17 may not be provided in the form of a film or a layer to cover the entire region of the first nitride semiconductor layer 15.

Since the nano-structure 17 cannot serve as a seed layer to form the second nitride semiconductor layer 19, the diameter of the nano-structure 17 may be variously selected in the range of several nano-meters (nm) to several hundreds nano-meters (nm) depending on the type or the size of the light emitting device.

The second nitride semiconductor layer 19 may be formed on the first nitride semiconductor layer 15 and the nano-structure 17.

The second nitride semiconductor layer 19 may not be easily grown on the nano-structure 17. Therefore, the nano-structure 17 is locally formed on the top surface of the first nitride semiconductor layer 15, so that the first nitride semiconductor layer 15 may be exposed by the nano-structure 17. Accordingly, the exposed first nitride semiconductor layer 15 is used as a seed so that the second nitride semiconductor layer 19 can be easily grown.

The nano-structure 17 may be randomly formed in the top surface of the first nitride semiconductor layer 15, the pit 13, or the pin hole. The nano-structure 17 may be fully filled with the pit 13 or the pin hole, but the embodiment is not limited thereto.

The dislocation 11 exposed to the top surface of the first nitride semiconductor layer 15 is blocked by the nano-structure 17 while the nano-structure 17 is filled in the pit 13 formed in the top surface of the first nitride semiconductor layer 15 and the pine hole vertically formed through the first nitride semiconductor layer 15. Therefore, defects existing in the first nitride can be removed by the nano-structure 17.

For example, all of the first nitride semiconductor layer 15, the nano-structure 17, and the second nitride semiconductor layer 19 may be simultaneously formed by using MOCVD equipment. For example, first, the first nitride semiconductor layer 15 including AlN may be formed by introducing TMAl, $NH_3$, and $N_2$ into the chamber of the MOCVD equipment. Then, the nano-structure 17 including SiN may be formed by introducing $SiH_4$, $NH_4$, and $N_2$ into the chamber of the same MOCVD equipment. Subsequently, the nitride semiconductor layer 19 may be formed by introducing TMAl, $NH_3$, and $N_2$ into the chamber of the same MOCVD equipment The first nitride semiconductor layer 15 may have the thickness of 1 nm to 150 nm, but the embodiment is not limited thereto. The second nitride semiconductor layer 19 may have the thickness of 10 nm to 3 μm, but the embodiment is not limited thereto. In other words, the second nitride semiconductor layer 19 may have the thickness 10 times to 20 times thicker than that of the first nitride semiconductor layer 15, but the embodiment is not limited thereto.

As described above, the second nitride semiconductor layer 19 may be easily grown on the first nitride semiconductor layer 15, and not easily grown on the nano-structure 17. Therefore, the second nitride semiconductor layer 19 may be primarily grown upward from the first nitride semiconductor layer 15 between the nano-structures 17. Then, the second nitride semiconductor layer 19 may be secondarily grown. In other words, the second nitride semiconductor layer 19 may be horizontally grown on the nano-structure 17 and vertically grown to a third semiconductor layer. In other words, the second nitride semiconductor layer 19 may be grown through an epitaxial lateral overgrowth (ELO) process.

Therefore, the dislocation 11 moved up along the first nitride semiconductor layer 15 is not directed upward due to the secondary growth of the second nitride semiconductor layer 19 in a horizontal direction, so that the dislocation 11 can be blocked.

Since the second nitride semiconductor layer 19 is not formed between the nano-structures 17, air may be filled in the space between the nano-structures 17 formed in the pit 13 or the pin hole. Therefore, since the nano-structure 17 formed on the second nitride semiconductor layer 19 or the nano-structure 17 and the air provided in the pit 13 or the pin hole have refractive indexes different from that of the second nitride semiconductor layer 19, light is refracted by the nano-structure 17 or the air, so that the light may be scattered or reflected.

Since the first nitride semiconductor layer 15 and the second nitride semiconductor layer 19 have compressive stress, the compressive stress of the first and second nitride semiconductor layers 15 and 16 is stress-equivalent to the tensile stress when the semiconductor substrate 10 is cooled in the subsequent process. Accordingly, cracks can be prevented in the conductive substrate, and the growth substrate 1 is not broken. In this case, the stress-equilibrium may refer to that the compressive stress is equal to or similar to the tensile stress in intensity. For example, when the compressive stress or the tensile stress is measured, the compressive stress may be expressed as a negative (−) direction, and the tensile stress may be expressed as a positive (+) direction. In this case, if the stress-equilibrium is achieved, the stress intensity is zero, or approximates to zero.

Figure 3:
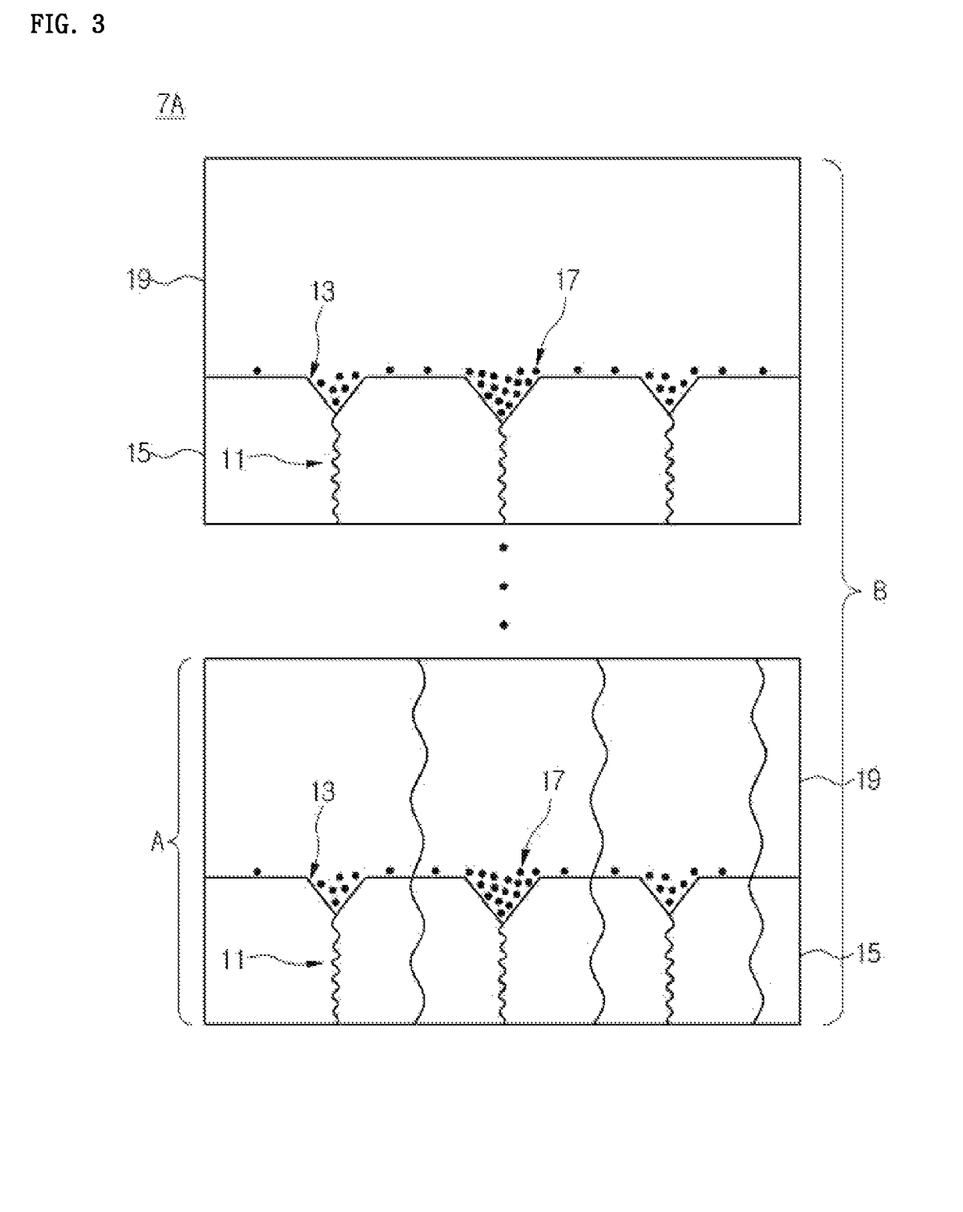
FIG. 3 is a sectional view showing a control layer according to a second embodiment.

FIG. 3 is a sectional view showing a control layer according to the second embodiment. The second embodiment is the same as the first embodiment except that the first nitride semiconductor layer 15, the nano-structures 17, and the second nitride semiconductor layer 19, which are formed at one cycle A, are repeatedly formed by B times. In the following description of the second embodiment, the same reference numerals will be assigned to the same elements having the same functions and shapes as those of the first embodiment, and the details thereof will be omitted.

Referring to FIG. 3, in a control layer 7A according to the second embodiment, the first nitride semiconductor layer 15, the nano-structures 17, and the second nitride semiconductor layer 19, which are formed at one cycle A, may be repeatedly formed by B times. In this case, the B times may be 50 times or not, but the embodiment is not limited thereto.

The control layer 7A according to the second embodiment may be formed at a sufficiently thin thickness so that the control layer 7A has a superlattice structure in which the first nitride semiconductor layer 15, the nano-structures 17, and the second nitride semiconductor layer 19 are formed by B times.

As described above, the thickness of the first nitride semiconductor layer 15 may be in the range of 1 nm to 150 nm, but the embodiment is not limited thereto. The second nitride semiconductor layer 19 may has the thickness in the range of 10 nm to 3 μm, but the embodiment is not limited thereto. The nano-structures 17 may be spaced apart from each other in a horizontal direction. Each nano-structure 17 may be sufficiently thin to the extent that the nano-structure 17 cannot be measured in height. Since the nano-structures 17 are randomly formed, the nano-structures 17 may have heights different from each other, but the embodiment is not limited thereto. For example, the thickness of the nano-structure 17 may be in the range of 3 Å to 50 Å, but the embodiment is not limited thereto.

According to the second embodiment, the first nitride semiconductor layer 15, the nano-structures 17, and the second nitride semiconductor layer 19 are formed at a cycle taken B times, thereby more enhancing the compressive stress to easily control stress so that the enhanced compressive stress makes stress-equilibrium together with tensile stress when the semiconductor substrate 10 is cooled.

In addition, according to the second embodiment, the dislocation 11 is inclined by the second nitride semiconductor layer 19, so that the dislocation 11 is not moved up any more. Second nitride semiconductor layers 19 are formed by B times, so that the dislocation 11 can be perfectly blocked. In other words, even if the dislocation 11 is not blocked by the second nitride semiconductor layer 19 formed at the first cycle, the dislocation 11 can be blocked by the nitride semiconductor layer formed at the second period. If the dislocation 11 is not blocked by the second nitride semiconductor layer 19 formed at the second cycle, the dislocation 11 can be blocked by the second nitride semiconductor layer 19 formed at the third cycle.

Figure 4:
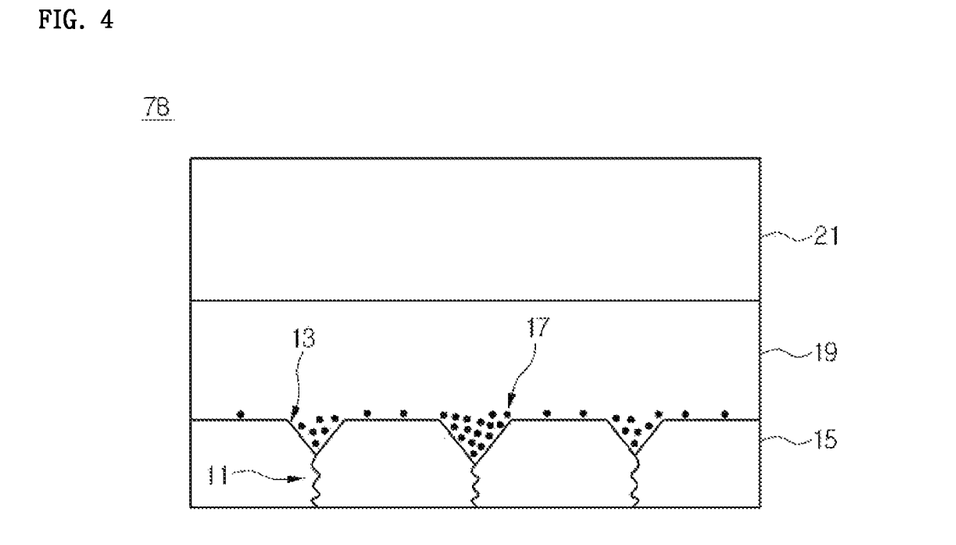
FIG. 4 is a sectional view showing a control layer according to a third embodiment.

FIG. 4 is a sectional view showing a control layer according to a third embodiment. The third embodiment is the same as the first embodiment except that a third nitride semiconductor layer 21 is formed on the second nitride semiconductor layer 19. In the following description of the third embodiment, the same reference numerals will be assigned to the same elements having the same functions and shapes as those of the first embodiment, and the details thereof will be omitted.

Referring to FIG. 4, a control layer 7B according to the third embodiment may include the first nitride semiconductor layer 15, the nano-structures 17, the second nitride semiconductor layer 19, and the third nitride semiconductor layer 21.

Since the first nitride semiconductor layer 15, the nano-structures 17, the second nitride semiconductor layer 19 according to the third embodiment are the same as those of the first embodiment in terms of function or shape, the details thereof will be omitted.

For example, the third nitride semiconductor layer 21 may be a Ga-based nitride semiconductor layer, but the embodiment is not limited thereto. For example, the third nitride semiconductor layer 21 may include GaN or AlGaN, but the embodiment is not limited thereto.

The second nitride semiconductor layer 19 and the third nitride semiconductor layer 21 may include the same type of compound semiconductor materials, but the embodiment is not limited thereto. For example, the second nitride semiconductor layer 19 and the third nitride semiconductor layer 21 may include GaN, but the embodiment is not limited thereto.

The third nitride semiconductor layer 21 may include dopants. For example, the dopant may include an N-type dopant including at least one of Si, Ge, Sn, Se, and Te, but the embodiment is not limited thereto.

The third nitride semiconductor layer 21 may have the thickness in the range of 10 nm to 3 μm, but the embodiment is not limited thereto.

The third nitride semiconductor layer 21 may have a thickness equal to or approximate to the thickness of the second nitride semiconductor layer 19, but the embodiment is not limited thereto.

The third nitride semiconductor layer 21 may have low-concentration dopants so that the intensity of the compressive stress is increased, but the embodiment is not limited thereto. For example, the dopant concentration of the third nitride semiconductor layer 21 may be 1E18/cm3 or less, but the embodiment is not limited thereto.

Therefore, the third nitride semiconductor layer 21 may have only one dopant, or may have up to 1E18/cm3 of dopants, but the embodiment is not limited thereto. The dopant concentration of the third nitride semiconductor layer 21 may be in the range of 1/cm3 to 1E18/cm3, but the embodiment is not limited thereto.

If the third nitride semiconductor layer 21 has high-concentration dopants, the third nitride semiconductor layer 21 may have tensile stress, so that the stress-equilibrium may not be achieved when the semiconductor substrate 10 is cooled later.

In addition to elements of the first embodiment, the third embodiment further includes the third nitride semiconductor layer 21, and the intensity of the compressive stress is increased by the third nitride semiconductor layer 21, so that the stress-equilibrium can be easily maintained.

Figure 5:
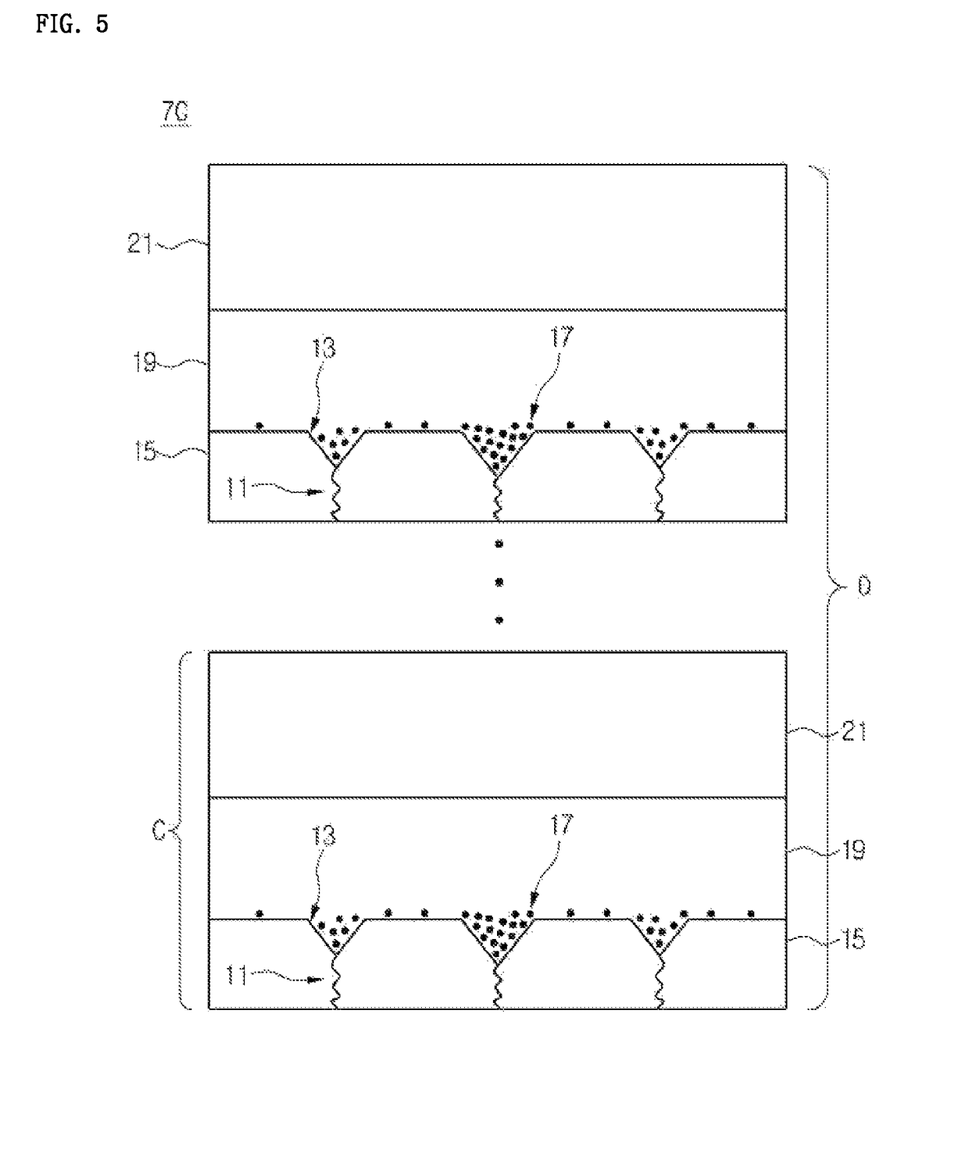
FIG. 5 is a sectional view showing a control layer according to a fourth embodiment.

FIG. 5 is a sectional view showing a control layer according to a fourth embodiment. The fourth embodiment is similar to the third embodiment except that the first nitride semiconductor layer 15, the nano-structures 17, the second nitride semiconductor layer 19, and the third nitride semiconductor layer 21, which are formed at one cycle C, are repeatedly formed by D times. In the following description of the fourth embodiment, the same reference numerals will be assigned to the same elements having the same functions and shapes as those of the third embodiment, and the details thereof will be omitted.

Referring to FIG. 5, in a control layer 7C according to the fourth embodiment, the first nitride semiconductor layer 15, the nano-structures 17, the second nitride semiconductor layer 19, and the third nitride semiconductor layer 21, which are formed at one cycle C, may be repeatedly formed by D times. In this case, the D times may be 50 times or not, but the embodiment is not limited thereto.

The control layer 7C according to the fourth embodiment may be formed at a significantly thin thickness so that the control layer 7C has a superlattice structure in which the first nitride semiconductor layer 15, the nano-structures 17, the second nitride semiconductor layer 19, and the third nitride semiconductor layer 21 are formed by D times.

According to the fourth embodiment, the first nitride semiconductor layer 15, the nano-structures 17, the second nitride semiconductor layer 19, and the third nitride semiconductor layer 21 are formed at a cycle taken D times, thereby more enhancing the compressive stress to easily control stress so that the enhanced compressive stress makes stress-equilibrium together with tensile stress when the semiconductor substrate 10 is cooled.

In addition, according to the fourth embodiment, the dislocation 11 is inclined by the second nitride semiconductor layer 19, so that the dislocation 11 is not moved up any more. Second nitride semiconductor layers 19 are formed by D times, so that the dislocation 11 can be perfectly blocked. In other words, even if the dislocation 11 is not blocked by the second nitride semiconductor layer 19 formed at the first cycle, the dislocation 11 can be blocked by the nitride semiconductor layer formed at the second period. If the dislocation 11 is not blocked by the second nitride semiconductor layer 19 formed at the second cycle, the dislocation 11 can be blocked by the second nitride semiconductor layer 19 formed at the third cycle.

According to the fourth embodiment, the third nitride semiconductor layer 21 is formed at each cycle C to enhance compressive stress, and third nitride semiconductor layers 21 are stacked by D times to increase the intensity of the compressive stress, so that the stress can be easily controlled.

Figure 6:
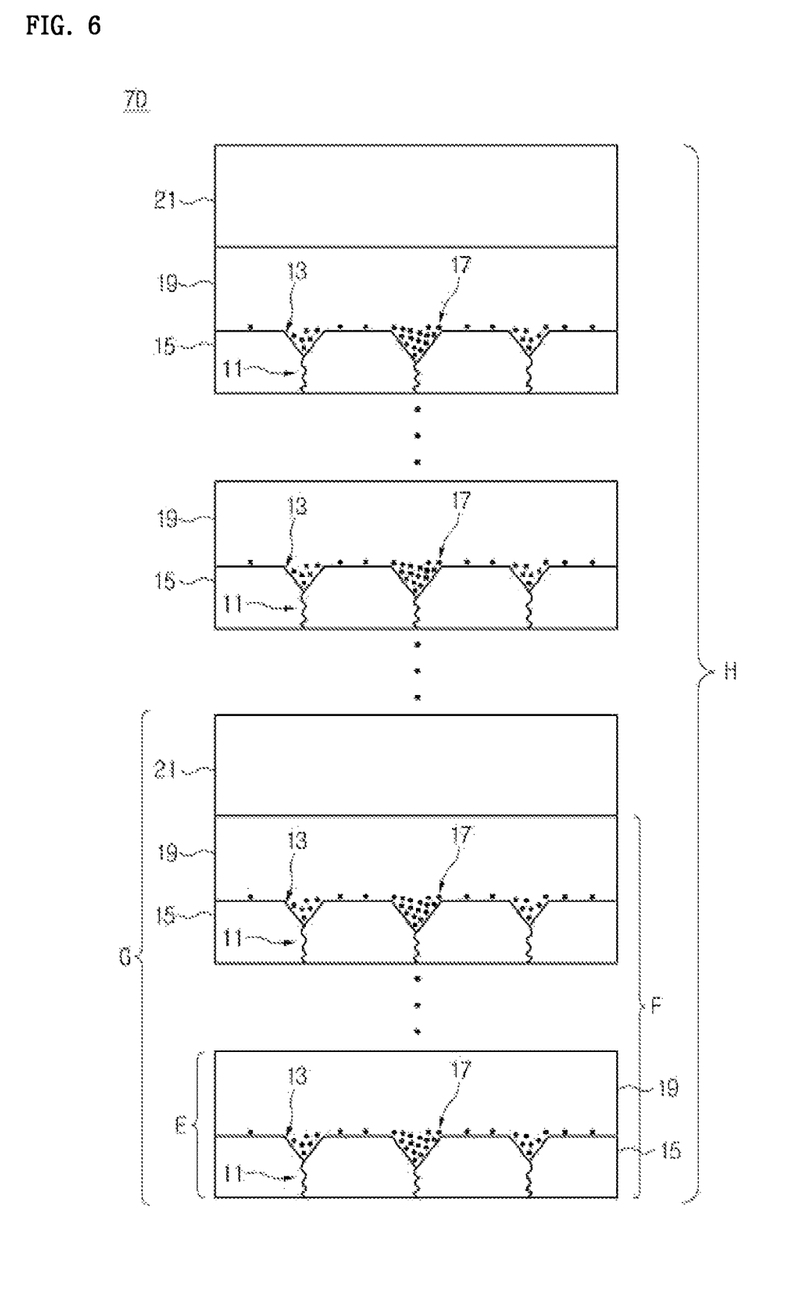
FIG. 6 is a sectional view showing a control layer according to a fifth embodiment.

FIG. 6 is a sectional view showing a control layer according to a fifth embodiment. The fifth embodiment is similar to the fourth embodiment except that the first nitride semiconductor layer 15, the nano-structures 17, and the second nitride semiconductor layer 19 are repeatedly formed. In the following description of the fifth embodiment, the same reference numerals will be assigned to the same elements having the same functions and shapes as those of the third embodiment and/or the fourth embodiment, and the details thereof will be omitted.

Referring to FIG. 6, in a control layer 7D according to the fifth embodiment, the first nitride semiconductor layer 15, the nano-structures 17, and the second nitride semiconductor layer 19 formed at one cycle E may be repeatedly formed by F times. In addition, the first nitride semiconductor layer 15, the nano-structures 17, the second nitride semiconductor layer 19, and the third nitride semiconductor layer 21 formed at one cycle G may be repeatedly formed by H times. In this case, the F times and/or the H times may be 50 times or less, but the embodiment is not limited thereto.

Figure 7:
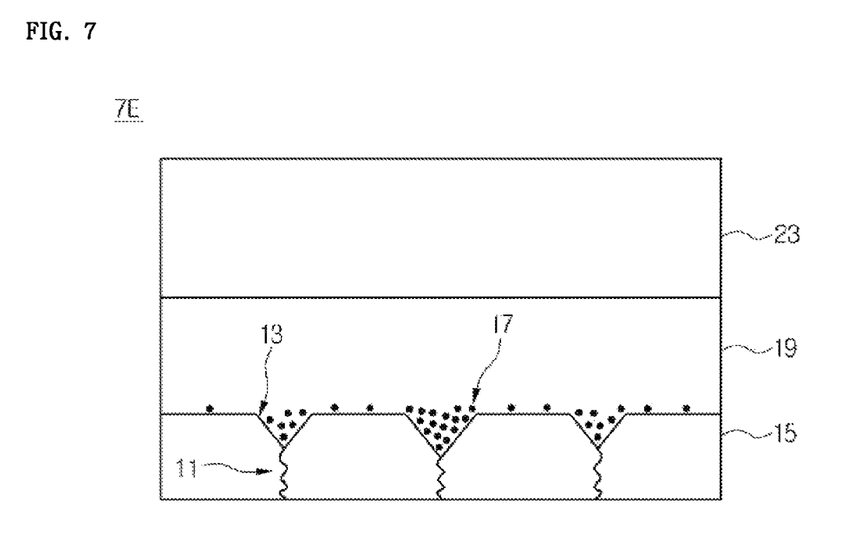
FIG. 7 is a sectional view showing a control layer according to a sixth embodiment.

FIG. 7 is a sectional view showing a control layer according to a sixth embodiment. The sixth embodiment is substantially similar to the first embodiment except that a fourth nitride semiconductor layer 23 is formed on the second nitride semiconductor layer 19. In the following description of the sixth embodiment, the same reference numerals will be assigned to the same elements having the same functions and shapes as those of the first embodiment, and the details thereof will be omitted.

Referring to FIG. 7, a control layer 7E according to the sixth embodiment may include the first nitride semiconductor layer 15, the nano-structures 17, the second nitride semiconductor layer 19, and the fourth nitride semiconductor layer 23.

Since the first nitride semiconductor layer 15, the nano-structures 17, the second nitride semiconductor layer 19 are the same as those of the first embodiment in terms of function or shape, the details thereof will be omitted.

For example, the fourth nitride semiconductor layer 23 may include a Ga-based nitride semiconductor layer, but the embodiment is not limited thereto. For example, the fourth nitride semiconductor layer 23 may include GaN or AlGaN, but the embodiment is not limited thereto.

The fourth nitride semiconductor layer 23 and the second nitride semiconductor layer 19 may include the same type of compound semiconductor materials, but the embodiment is not limited thereto. For example, the fourth nitride semiconductor layer 23 and the second nitride semiconductor layer 19 may include GaN, but the embodiment is not limited thereto.

The fourth nitride semiconductor layer 23 may not include dopants. In other words, the fourth nitride semiconductor layer 23 may include a non-conductive nitride semiconductor layer that is not doped with dopants.

The thickness of the fourth nitride semiconductor layer 23 may be in the range of 10 nm to 3 μm, but the embodiment is not limited thereto. The thickness of the fourth nitride semiconductor layer 23 may be one time to three times thicker than the thickness of the second nitride semiconductor layer 19, but the embodiment is not limited thereto.

The fourth nitride semiconductor layer 23 may compensate for the degradation of the layer quality caused by the first nitride semiconductor layer 15 and the second nitride semiconductor layer 19. In other words, the fourth nitride semiconductor layer 23 is grown on the second nitride semiconductor layer 19 while being maintained with superior quality, so that the surface roughness on the top surface of the second nitride semiconductor layer 19 can be minimized. Accordingly, the fourth nitride semiconductor layer 23 may have a flat surface.

In addition to elements of the first embodiment, the sixth embodiment further includes the fourth nitride semiconductor layer 23, and a flat surface is formed by the fourth nitride semiconductor layer 23, so that the conductive semiconductor layer 9 formed on the fourth nitride semiconductor layer 23 may have a superior layer quality and a flat surface.

Figure 8:
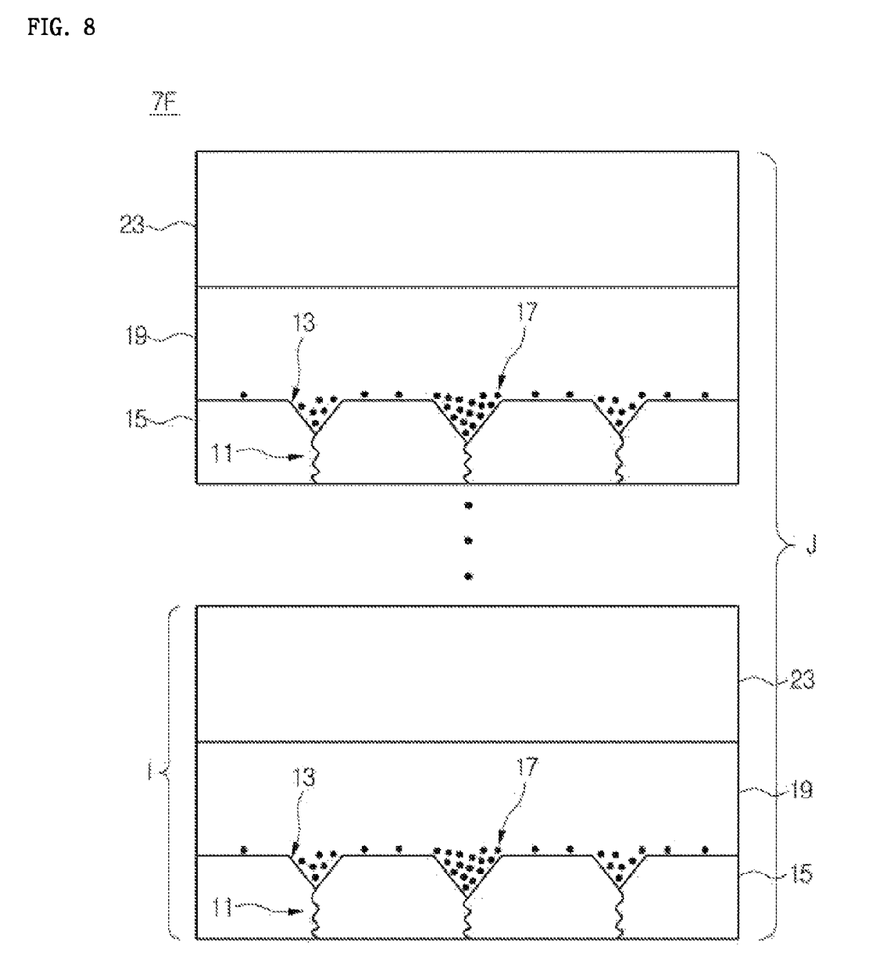
FIG. 8 is a sectional view showing a control layer according to a seventh embodiment.

FIG. 8 is a sectional view showing a control layer according to according to a seventh embodiment. The seventh embodiment is similar to the sixth embodiment except that the first nitride semiconductor layer 15, the nano-structures 17, the second nitride semiconductor layer 19, and the fourth nitride semiconductor layer 23 formed at one cycle I are repeatedly formed by J times. In the following description of the seventh embodiment, the same reference numerals will be assigned to the same elements having the same functions and shapes as those of the sixth embodiment, and the details thereof will be omitted.

Referring to FIG. 8, in a control layer 7F according to the seventh embodiment, the first nitride semiconductor layer 15, the nano-structures 17, the second nitride semiconductor layer 19, and the fourth nitride semiconductor layer 23 formed at one cycle I may be repeatedly formed by J times.

The control layer 7F according to the seventh embodiment may be formed at a significantly thin thickness so that the control layer 7F has a superlattice structure in which the first nitride semiconductor layer 15, the nano-structures 17, the second nitride semiconductor layer 19, and the fourth nitride semiconductor layer 23 are formed by J times.

According to the seventh embodiment, the first nitride semiconductor layer 15, the nano-structures 17, the second nitride semiconductor layer 19 and the fourth nitride semiconductor layer 23 are formed by J times, thereby more enhancing compressive stress to easily control stress so that the enhanced compressive stress makes stress-equilibrium together with tensile stress when the semiconductor substrate 10 is cooled.

According to the seventh embodiment, the dislocation 11 is inclined by the second nitride semiconductor layer 19, so that the dislocation 11 is not moved up. The second nitride semiconductor layers 19 are formed by B times, so that the dislocation 11 can be perfectly blocked.

According to the seventh embodiment, a fourth conductive nitride semiconductor layer having a flat surface may be formed at each period I, and fourth nitride semiconductor layers 23 may be stacked by J times, so that the conductive semiconductor layer 9 having superior layer quality is formed. Accordingly, the optical and electrical characteristics can be improved.

Figure 9:
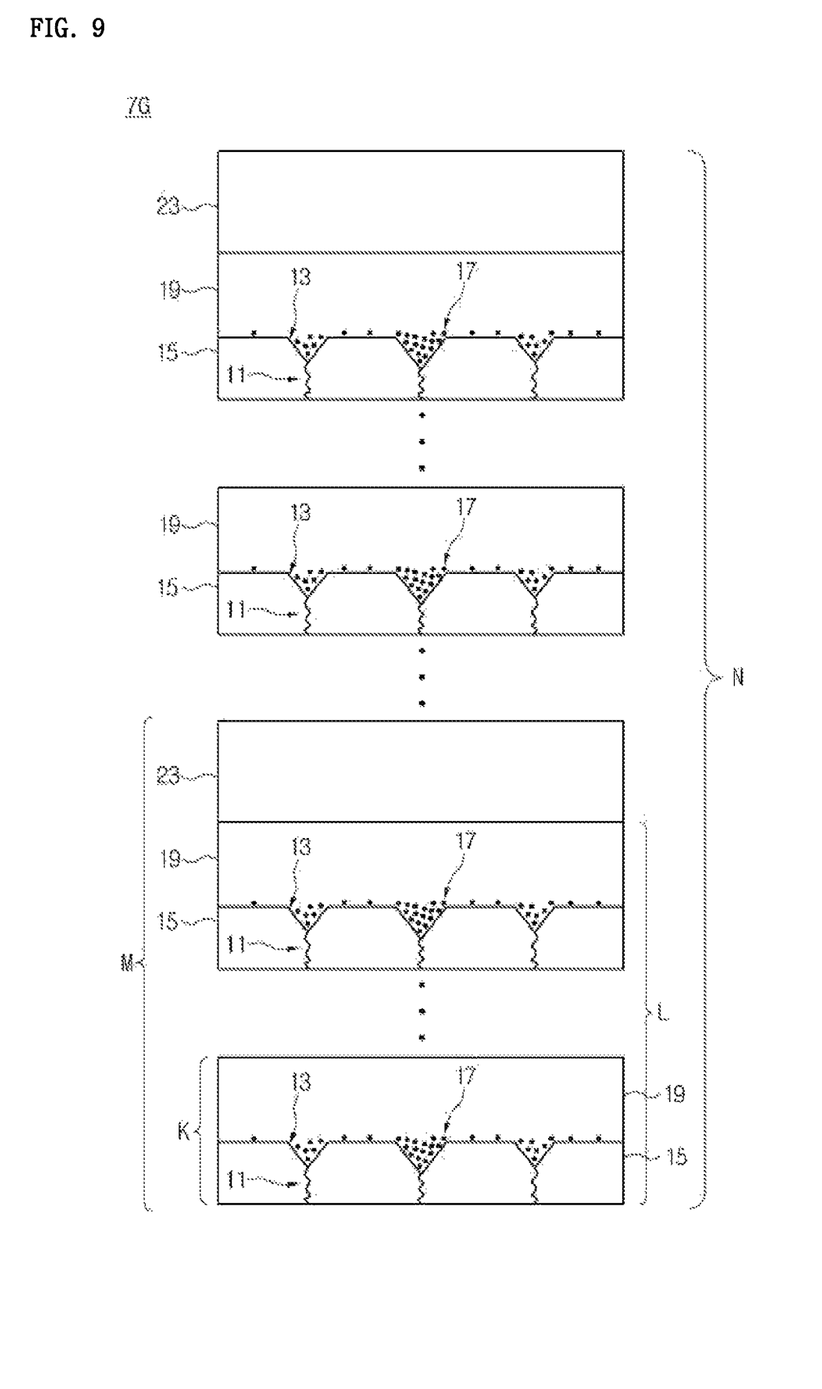
FIG. 9 is a sectional view showing a control layer according to an eighth embodiment.

FIG. 9 is a sectional view showing a control layer according to an eighth embodiment. The eighth embodiment is similar to the seventh embodiment except that the first nitride semiconductor layer 15, and the second nitride semiconductor layer 19 are repeatedly formed. In the following description of the eighth embodiment, the same reference numerals will be assigned to the same elements having the same functions and shapes as those of the sixth and/or seventh embodiment, and the details thereof will be omitted.

Referring to FIG. 9, in a control layer 7G according to the eighth embodiment, the first nitride semiconductor layer 15, the nano-structures 17, and the second nitride semiconductor layer 19 formed at one cycle K may be repeatedly formed by L times. In addition, the first nitride semiconductor layer 15, the nano-structures 17, the second nitride semiconductor layer 19, and the fourth nitride semiconductor layer 23 formed at one cycle M may be repeatedly formed by N times. In this case, the L times and/or the N times may be 50 times or less, but the embodiment is not limited thereto.

Figure 10:
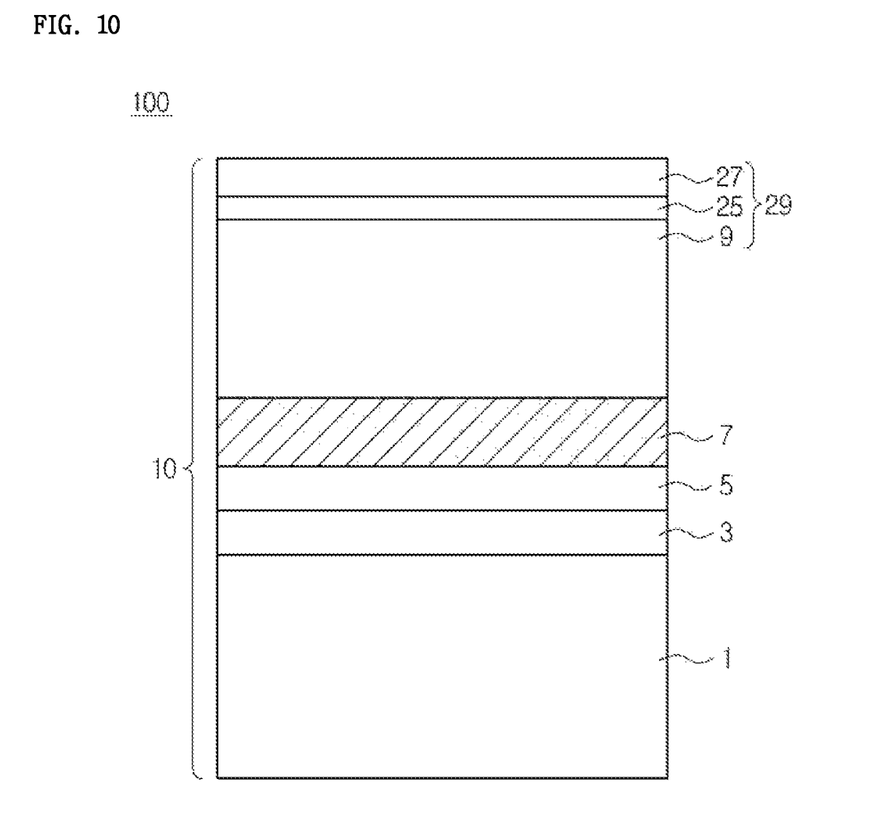
FIG. 10 is a sectional view showing a light emitting device according to the embodiment.

FIG. 10 is a sectional view showing a light emitting device according to the embodiment. The light emitting device 100 according to the embodiment may be fabricated by using the semiconductor substrate 10 according to the first embodiment to the eighth embodiment. In the following description of the embodiment, the same reference numerals will be assigned to elements having the same functions and shapes as those of the semiconductor substrate 10 according to the first embodiment to the eighth embodiment, and the details thereof will be omitted.

Referring to FIG. 10, the light emitting device 100 according to the embodiment may include a growth substrate 1, a buffer layer 3, a non-conductive semiconductor layer 5, a control layer 7, a first conductive semiconductor layer 9, an active layer 25, and a second conductive semiconductor layer 27.

The growth substrate 1, the buffer layer 3, the non-conductive semiconductor layer 5, the control layer 7, and the first conductive semiconductor layer 9 may constitute the semiconductor substrate 10 according to the first embodiment to the eighth embodiment, but the embodiment is not limited thereto.

Since the growth substrate 1, the buffer layer 3, the non-conductive semiconductor layer 5, and the control layer 7 have been described, the details thereof will be omitted.

The first conductive semiconductor layer 9, the active layer 25, and the second conductive semiconductor layer 27 may constitute a light emitting structure 29, but the embodiment is not limited thereto.

The first conductive semiconductor layer 9, the active layer 25, and the second conductive semiconductor layer 27 may be formed of $Al_xIn_yGa_{(1-x-y)}N$ (0<x<1, 0<y<1, and 0<x+y<1) including a group II-VI or III-V compound semiconductor material. The first conductive semiconductor layer 9, the active layer 25, and the second conductive semiconductor layer 27 may include at least one selected from the group consisting of InAlGaN, GaN, AlGaN, InGaN, AlN, InN and AlInN, but the embodiment is not limited thereto.

The first conductive semiconductor layer 9 may include an N-type semiconductor layer including N-type dopants as described above, but the embodiment is not limited thereto. The N-type dopant may include at least one of Si, Ge, Sn, Se, and Te, but the embodiment is not limited thereto.

The active layer 25 may be formed on the first conductive semiconductor layer 9. The active layer may emit light having a wavelength corresponding to the energy bandgap according to the material constituting the active layer 25 through the re-combination between electrons from the first conductive semiconductor layer 9 and the holes from the second conductive semiconductor layer 27.

The active layer 25 may include one of a multi-quantum well structure (MQW), a quantum dot structure and a quantum wire structure. In the active layer 25, well and barrier layers formed at one cycle may be repeatedly formed. The repetition cycle of a well layer and a barrier layer may be varied depending on the characteristic of the light emitting device 100, but the embodiment is not limited thereto.

For example, the active layer 25 may be formed at a cycle of InGaN/GaN, a cycle of InGaN/AlGaN or a cycle of InGaN/InGaN. The bandgap of the barrier layer may be greater than that of the well layer.

The second conductive semiconductor layer 27 may include a P-type semiconductor layer including P-type dopants as described above, but the embodiment is not limited thereto. The P-type dopant may include at least one of Mg, Zn, Ca, Sr, and Ba, but the embodiment is not limited thereto.

Although not shown, a reflective electrode layer or a transparent electrode layer may be formed on the second conductive semiconductor layer 27 depending on the type of the light emitting structure 29.

Although not shown, a first electrode may be formed on the first conductive semiconductor layer 9, and a second electrode may be formed on the second conductive semiconductor layer 27. Alternatively, the first electrode may be formed under the first conductive semiconductor layer 9, and the second electrode may be formed on the second conductive semiconductor layer 27, but the embodiment is not limited thereto. The first electrode may make contact with the first conductive semiconductor layer 9 after the growth substrate 1 has been removed, or may be formed under the growth substrate 1, but the embodiment is not limited thereto. The second electrode may include a reflective metal material to reflect light, but the embodiment is not limited thereto.

The first and second electrodes may include one selected from the group consisting of Al, Ti, Cr, Ni, Pt, Au, W, Cu, and Mo, or the multi-structure thereof, but the embodiment is not limited thereto.

Figure 11:
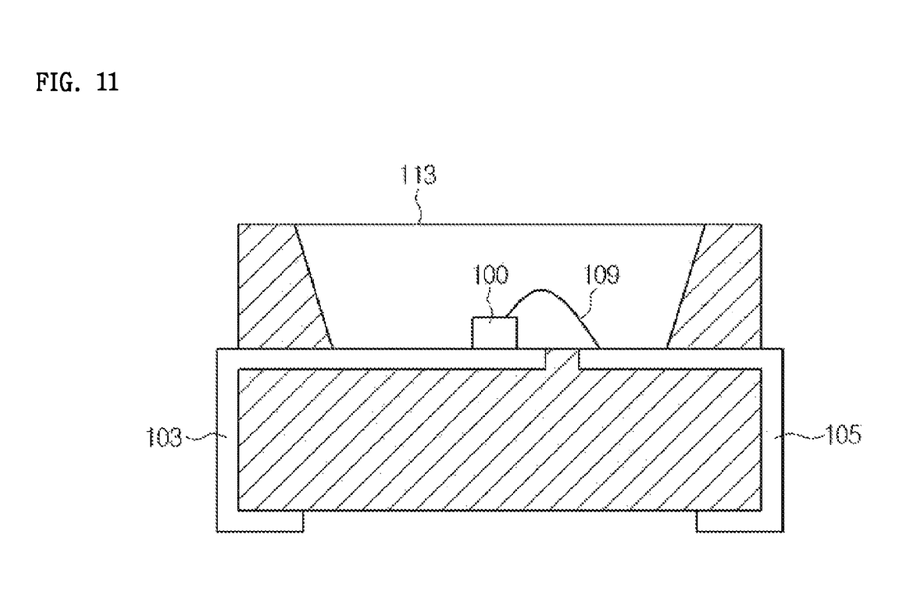
FIG. 11 is a sectional view showing a light emitting device package according to the embodiment.

FIG. 11 is a sectional view showing a light emitting device package according to the embodiment. The light emitting device package according to the embodiment may be fabricated by using the light emitting device shown in FIG. 10. Referring to FIG. 11, the light emitting device package according to the embodiment includes a body, first and second electrode layers 103 and 105 installed in the body, the light emitting device 100 shown in FIG. 10, which receives power from the first and second electrode layers 103 and 105, and a molding member 113 to surround the light emitting device 100.

The body may include silicon, synthetic resin or metallic material, and an inclined surface may be formed in the vicinity of the light emitting device 100. The first and second electrode layers 103 and 105 are electrically isolated from each other to supply power to the light emitting device 100.

The first and second electrode layers 103 and 105 can improve the light efficiency by reflecting the light emitted from the light emitting device 100. Further, the first and second electrode layers 103 and 105 dissipate heat generated from the light emitting device 100 to the outside.

The light emitting device 100 can be provided on any one of the body 120 and the first and second electrode layers 103 and 105. The light emitting device 100 may be electrically connected to the first and second electrode layers 103 and 105 through one of a wire scheme and a die-bonding scheme, but the embodiment is not limited thereto.

According to the embodiment, although the light emitting device 100 is electrically connected to one of the first and second electrode layers 103 and 105 through one wire for illustrative purpose, the embodiment is not limited thereto. In other words, the light emitting device 100 may be electrically connected to the first and second electrode layers 103 and 105 by using two wires. Alternatively, the light emitting device 100 may be electrically connected to the first and second electrode layers 103 and 105 without the wire.

The molding member 113 may surround the light emitting device 100 to protect the light emitting device 100. In addition, the molding member 113 may include phosphors to change the wavelength of the light emitted from the light emitting device 100.

The light emitting device package according to the embedment includes a chip on board (COB) type light emitting device package. In this case, the top surface of the body is flat, and a plurality of light emitting devices may be installed in the body.

The light emitting device 100 or the light emitting device package according to the embodiment may be applied to a light unit. The light unit may be applied to a display device and a lighting device such as a unit including a lamp, a signal lamp, a headlight of a vehicle, an electric sign board, or an indicator lamp.

Figure 12:
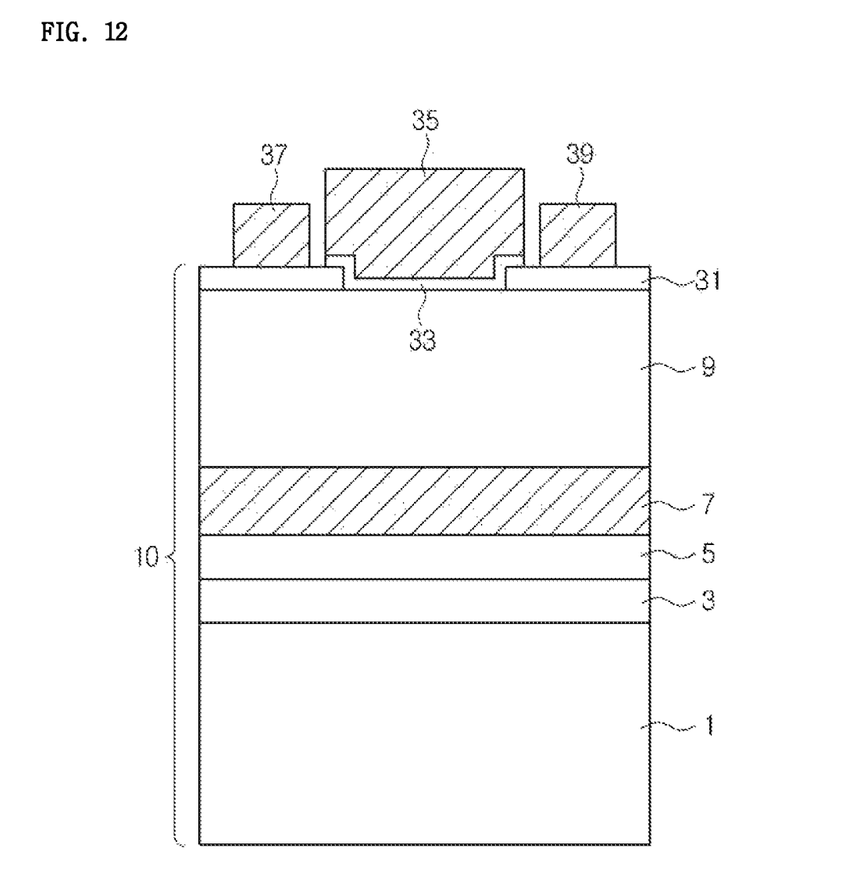
FIG. 12 is a sectional view showing an MOSFET according to the embodiment.

FIG. 12 is a sectional view showing an MOSFET according to the embodiment. The MOSFET is an electronic switching device. Referring to FIG. 12, according to the embodiment, the MOSFET may include the growth substrate 1, the buffer layer 3, the non-conductive semiconductor layer 5, the control layer 7, the first conductive semiconductor layer 9, the second conductive semiconductor layer 31, a channel layer 33, a gate electrode 35, a source electrode 37, and a drain electrode 39.

The growth substrate 1, the buffer layer 3, the non-conductive semiconductor layer 5, the control layer 7 and the first conductive semiconductor layer 9 may be the same as those of the light emitting device 10, but the embodiment is not limited thereto.

Since the growth substrate 1, the buffer layer 3, the non-conductive semiconductor layer 5, and the control layer 7 have been described, the details thereof will be omitted.

The first conductive semiconductor layer 9 may include an N-type semiconductor layer including N-type dopants, and the second conductive semiconductor layer 31 may include a P-type semiconductor layer including P-type dopants, but the embodiment is not limited thereto.

Second conductive semiconductor layers 31 may be formed on both regions of the first conductive semiconductor layer 9, but the embodiment is not limited thereto.

The bottom surface of the second conductive semiconductor layer 31 may make contact with the first conductive semiconductor layer 9, but the embodiment is not limited thereto.

The channel layer 33 may be formed at the central region of the first conductive semiconductor layer 9. In other words, the channel layer 33 may be formed on the first conductive semiconductor layer 9 between the second conductive semiconductor layers 31. The channel layer 33 may make contact with the top surface of the first conductive semiconductor layer 9, and may make contact with a portion of the top surface and the lateral side of the second conductive semiconductor layer 31, but the embodiment is not limited thereto.

The gate electrode 35 may be formed on the channel layer 33, and the source and drain electrodes 37 and 39 may be formed on the second conductive semiconductor layers 31, respectively. The size of the gate electrode 35 may be equal to that of the channel layer 33, but the embodiment is not limited thereto.

The source and drain electrodes 37 and 39 may be spaced apart from the gate electrode 35. Each of the source and drain electrodes 37 and 39 may be formed on a portion of the second conductive semiconductor layer 31, but the embodiment is not limited thereto.

The channel layer 33 is conducted by a control signal provided to the gate electrode 35 so that a signal may be transmitted from the drain electrode 39 to the source electrode 37.

Since the MOSFET according to the embodiment is fabricated by using a nitride semiconductor, the mobility of electrons from the first conductive semiconductor layer 9 is remarkably greater than that of electrons in a conventional Si-based MOSFET. Accordingly, the MOSFET can be switched at a high speed.

According to the embodiment, the control layer is interposed between the growth substrate and the conductive semiconductor layer to control stress, so that the growth substrate can be prevented from being broken or cracked.

According to the embodiment, the dislocation moved up is blocked by the control layer interposed between the growth substrate and the conductive semiconductor layer, so that the dislocation is not moved to the conductive semiconductor layer. Accordingly, the crystallinity of the conductive semiconductor layer can be improved.

The embodiment provides a semiconductor substrate capable of ensuring reliability.

The embodiment provides a semiconductor substrate capable of improving the crystallinity by preventing dislocation.

The embodiment provides a semiconductor substrate capable of improving a yield rate by controlling stress to prevent cracks.

The embodiment provides a light emitting device using the semiconductor substrate.

The embodiment provides an electronic device using the semiconductor substrate.

According to the first embodiment, there is provided a semiconductor substrate including a substrate, a first conductive semiconductor layer on the substrate, and a control layer interposed between the substrate and the first conductive semiconductor layer. The control layer includes a first nitride semiconductor layer including Al, a plurality of nano-structures on the first nitride semiconductor layer, and a second nitride semiconductor layer provided on the first nitride semiconductor layer and including Ga.

According to the second embodiment, there is provided a light emitting device including the semiconductor substrate according to the first embodiment, an active layer on the semiconductor substrate, and a second conductive semiconductor layer disposed on the active layer and including second dopants having polarity opposite to that of first dopants of a first conductive semiconductor layer of the semiconductor substrate.

According to the third embodiment, there is provided an electronic device including the semiconductor substrate according to the first embodiment, a second conductive semiconductor layer disposed on both regions of the semiconductor substrate and including second dopants having polarity opposite to that of first dopants of a first conductive semiconductor layer of the semiconductor substrate, a channel layer disposed on the central region of the semiconductor substrate, a gate electrode disposed on the channel layer, and source and drain electrodes formed on the second conductive semiconductor layer disposed at both regions of the semiconductor substrate.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
   a substrate;
   a first conductive semiconductor layer disposed on the substrate; and
   a control layer disposed between the substrate and the first conductive semiconductor layer, wherein the control layer includes a first nitride semiconductor layer having aluminum (Al), a plurality of nano-particles disposed in a recess of the first nitride semiconductor layer, and a second nitride semiconductor layer provided on the first nitride semiconductor layer and having gallium (Ga), and wherein air is filled between the nano-particles disposed in the recess.

2. The light emitting device of claim 1, wherein the recess is a pit or a pin hole.

3. The light emitting device of claim 2, wherein an air space is provided at least when the second nitride semiconductor layer is formed on the first nitride semiconductor layer.

4. The light emitting device of claim 1, wherein the nano particles include silicon nitride (SiN).

5. The light emitting device of claim 1, wherein the second nitride semiconductor layer has a thickness 10 times to 20 times thicker than a thickness of the first nitride semiconductor layer.

6. The light emitting device of claim 1, wherein the control layer has a superlattice structure.

7. The light emitting device of claim 1, wherein the control layer has a structure in which the first nitride semiconductor layer, the nano-structures, and the second nitride semiconductor layer, which are formed at one cycle, are repeatedly formed.

8. A light emitting device comprising:
   a substrate;
   a first conductive semiconductor layer on the substrate; and
   a control layer between the substrate and the first conductive semiconductor layer, wherein the control layer includes a first nitride semiconductor layer having aluminum (Al), a plurality of nano-particles disposed in a pit or a pin hole of the first nitride semiconductor layer, a second nitride semiconductor layer disposed on the first nitride semiconductor layer and having gallium (Ga), and a third nitride semiconductor layer on the second nitride semiconductor layer, the third nitride semiconductor layer having N-type dopants, wherein each nano-particle has a thickness in a range of 3 Å to 50 Å, wherein the plurality of nano-particles has the form of at least two assemblies, and wherein air is filled between the nano-particles.

9. The light emitting device of claim 8, wherein concentration of the N-type dopants is $1E18/cm^3$.

10. The light emitting device of claim 9, wherein the control layer has a structure in which the first nitride semiconductor layer, the nano-particles, and the second nitride semiconductor layer, which are formed at one cycle, are repeatedly formed.

11. The light emitting device of claim 10, wherein the control layer has a structure in which the first nitride semiconductor layer, the nano-particles, the second nitride semiconductor layer, and the third nitride semiconductor layer, which are formed at one cycle, are repeatedly formed.

12. The light emitting device of claim 8, wherein the nano-particles include silicon nitride (SiN).

13. The light emitting device of claim 8, wherein the second nitride semiconductor layer has a thickness 0.10 times to 20 times thicker than a thickness of the first nitride semiconductor layer.

14. A light emitting device comprising:
    a substrate;
    a first conductive semiconductor layer on the substrate; and
    a control layer between the substrate and the first conductive semiconductor layer, wherein the control layer includes a first nitride semiconductor layer having aluminum (Al), a plurality of nano-particles disposed in a plurality of recesses of the first nitride semiconductor layer, a second nitride semiconductor layer provided on the first nitride semiconductor layer and having gallium (Ga), and a fourth nitride semiconductor layer on the second nitride semiconductor layer, the fourth nitride semiconductor layer being prepared without dopants, wherein at least one nano-particle is provided at an interface of the first and the second nitride semiconductor Layers.

15. The light emitting device of claim 14, wherein the fourth nitride semiconductor layer has a thickness one to three times thicker than a thickness of the second nitride semiconductor layer.

16. The light emitting device of claim 14, wherein the control layer has a structure in which the first nitride semiconductor layer, the nano-particles, and the second nitride semiconductor layer, which are formed at one cycle, are repeatedly formed.

17. The light emitting device of claim 16, wherein the control layer has a structure in which the first nitride semiconductor layer, the nano-particles, the second nitride semiconductor layer, and the fourth nitride semiconductor layer, which are formed at one cycle, are repeatedly formed.

18. The light emitting device of claim 14, wherein the nano-particles include silicon nitride (SiN).

19. The light emitting device of claim 1, wherein each nano-particle has a thickness in a range of 3 Å to 50 Å.

* * * * *